United States Patent [19]

Sugie et al.

[11] 4,290,117

[45] Sep. 15, 1981

[54] MEMORY DEVICE WITH CIRCULATING STORAGE LOOPS

[75] Inventors: Mamoru Sugie, Hachioji; Noboru Yamaguchi, Kokubunji; Koichi Mayama, Mobara; Yuzo Kita, Fuchu; Shigeru Yoshizawa, Tokorozawa; Nobuo Saito, Mitaka; Atsushi Asano, Tokyo, all of Japan

[73] Assignee: Hitachi, Ltd., Tokyo, Japan

[21] Appl. No.: 13,066

[22] Filed: Feb. 21, 1979

[30] Foreign Application Priority Data

Feb. 17, 1978 [JP] Japan ................................. 53-16490

[51] Int. Cl.³ .............................................. G11C 19/08
[52] U.S. Cl. ........................................................ 365/15
[58] Field of Search ................................. 365/15, 200

[56] References Cited

U.S. PATENT DOCUMENTS

| | | | |
|---|---|---|---|
| 3,792,450 | 2/1974 | Bogar | 365/15 |
| 4,090,251 | 5/1978 | Flannigan | 365/15 |
| 4,159,412 | 6/1979 | Naden et al. | 365/15 |
| 4,168,534 | 9/1979 | Yoshizawa et al. | 365/15 |

Primary Examiner—James W. Moffitt
Attorney, Agent, or Firm—Craig and Antonelli

[57] ABSTRACT

In a memory device which has a plurality of recirculating type storage loops and in which information of the same addresses of the respective storage loops can be read and written in parallel, a memory device wherein information representing whether or not the corresponding storage loop is a bad or defective loop is written in a specified address of each of the storage loops.

8 Claims, 4 Drawing Figures

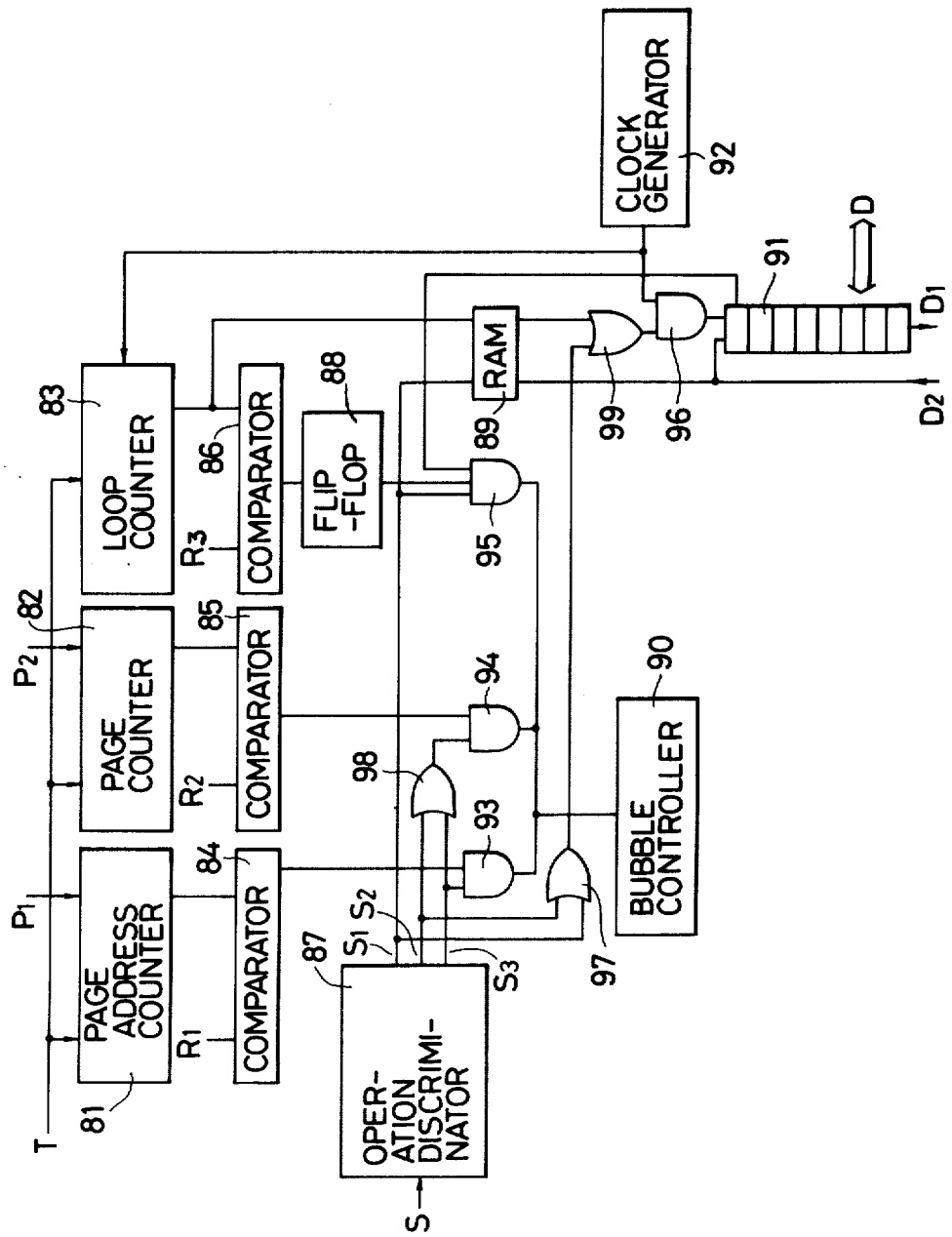
F/G. 4

MEMORY DEVICE WITH CIRCULATING STORAGE LOOPS

LIST OF THE PRIOR ART

The following references are cited to show the state of the art:
(1) Japanese Laid-Open Patent Application No. 52141/73
(2) Japanese Laid-Open Patent Application No. 82531/76

BACKGROUND OF THE INVENTION

1. Field of the Invention

This invention relates to a memory device having a plurality of circulating storage loops, such as a magnetic bubble memory.

2. Description of the Prior Art

In a magnetic bubble memory device which exploits bubble domains formed in magnetic thin films, a large number of storage loops are arrayed in parallel on each bubble chip, and information is written into or read out from bits of the respective storage loops having the same addresses in parallel.

In such a magnetic bubble memory device, the proportion of the cost of the bubble chips to that of the whole device is large. It is, therefore, important to enhance the yield of the bubble chips.

In a case where bubble chips having bad or defective storage loops are not assembled into the device when such defective chips have been produced in large numbers, the available percentage lowers noticeably. It is, therefore, common practice to enhance the available percentage by assembling the chips which include the defective storage loops.

In this case, however, a control arrangement must be provided to prevent the use of the defective storage loops for write and read on the basis of information indicating which storage loops of the bubble chip are defective.

In one prior art system having such a control arrangement, the positional information of the defective storage loops within the bubble chip is stored in an external read only memory (ROM) in advance. With this system, however, the read only memories need to be disposed in correspondence with the respective bubble chips. This renders the device very expensive. Moreover, the relationship between the bubble chips and the corresponding ROMs must be reliably managed, and the device cannot be used at all when the corresponding relations have been disordered.

There have, accordingly, been proposed other prior art systems wherein at least one special storage loop is disposed among a large number of storage loops and the positional information of the bad or defective storage loops is written in the special loop or loops in series or in parallel. This eliminates the problems of the management of the positional information of the defective storage loops.

In one of these systems, a plurality of special storage loops are disposed for the defective storage loop-positional information, and the succession of defective storage loop-positional information is written in parallel at the same addresses of these special storage loops. The same positional information as the aforecited information is written over all the addresses, and the positional information of the defective storage loops can be read during every operation carried out by assigning any desired address. This system can dispense with the external memories. On the other hand, assuming by way of example that the number of permissible defective loops is 4 and that the number of bits of the positional information is 8, 32 special storage loops must be disposed for storing the defective storage loop-positional information. Therefore, the bubble chip itself becomes larger in size and higher in cost. Moreover, it is necessary to secure a bubble chip in which all of the special loops within a specified area thereof are good or non-defective loops. Therefore, the system is not very useful for the enhancement of the yield.

In another prior art system, one or more storage loops for storing the defective storage loop-positional information are specially disposed within the bubble chip, and the positional information of the defective storage loops are successively written into the loop or loops in series. With this system, the number of the special loops decreases. On the other hand, in order to read out the defective storage loop-positional information and store them in a writable and readable random access memory (RAM) in advance, it is necessary to successively read out all of the information of the bubble chip to which the special loop belongs and to select the information from the special loop from among the read information. This leads to the disadvantage that a long time is required. It is, therefore, desirable to read out only the required information of the special loop and write it into the memory. In such a case, however, a special circuit is required, which results in the disadvantage of a complicated processing circuit.

SUMMARY OF THE INVENTION

It is, therefore, an object of the present invention to provide a memory device which has its yield significantly enhanced and its processing speed raised with a comparatively simple and inexpensive construction.

In order to accomplish this and other objects, according to this invention, information indicating whether or not a loop is defective is stored in a specified address position of each of a plurality of circulating type storage loops.

Other objects, features and advantages of the present invention will become more apparent from the following description taken in conjunction with the accompanying drawings.

BRIEF DESCRIPTION OF THE DRAWINGS

FIG. 4 is a block diagram of an embodiment of the principal portions of a bubble controller in FIG. 3.

DETAILED DESCRIPTION OF THE PREFERRED EMBODIMENTS

Figure 1:
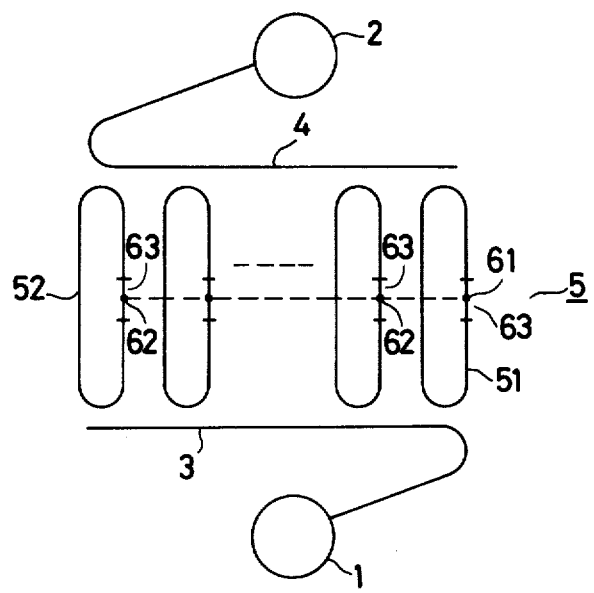
FIG. 1 is a constructional diagram of one embodiment of a bubble chip according to this invention.

Referring now to the drawings, FIG. 1 shows the construction of one embodiment of a bubble chip according to this invention with a bubble generator 1, a bubble detector 2, a write line 3, a read line 4, and a large number of storage loops 5.

By way of example, the multiplicity of storage loops 5 might consist of 288 storage loops including defective loops in order to form 256 good or non-destructive storage loops. One of the storage loops 51 which corresponds to the last bit of read-out data is used as a marker loop, while the other storage loops 52 are used as loops for storage. A single line which serves as both the write and read lines may be disposed without separately providing the write line 3 and the read line 4, if desired.

According to this embodiment of the invention, a bubble is written into a specified page address 61 of the marker loop 51 as a marker. Bubbles are written into the addresses 62 of the respective storage loops 52 corresponding to the page address in a case where the storage loops are not defective, and no bubble is written in a case where they are defective.

By way of example, suppose that each of the storage loops 5 is composed of 1,152 bits, among which 1,024 bits are used for storage while the remaining bits are not used therefor. Accordingly, the unused part is made a masked area 63, the specified bit of which is utilized as an address for storing the information indicating if the corresponding storage loop is defective. In the corresponding address of the marker loop 51, the address marker is written. The bubble may be written into only the address as the address marker as stated above, or alternatively, no bubble may be written into only the address.

In this manner, those areas other than the addresses for storage within the respective storage loops which are not ordinarily used are exploited as the masked areas, and the specified addresses of the masked areas are used as the addresses for storing the defect information of the corresponding loops. Therefore, the provision of special storage loops for storing the defective loop-positional information is unnecessary, and the bubble chip can be constructed in a small size and at low cost. And, of course, since the defective loop information can be stored within the bubble chip, the management of the defective loop information of the respective bubble chips of the device is easy. Furthermore, the bubble chip only requires that the marker loop is a good loop. Therefore, the yield of the bubble chips can be enhanced noticeably. Further, the processing time is noticeably shortened since the defective loop information is readily obtained simply by reading out the information of those addresses of the storage loops which correspond to the address in the marker loop with the address marker attached thereto.

The address marker of the marker loop described above can be used for coping with an unknown address at the time of the service interruption of a power supply. More specifically, a memory address sometimes becomes unknown due to the service interruption of a power supply. The memory address can be reset in such a way that the address marker is stipulated as a specified address and that the address marker within the marker loop is searched for after the recovery of the power supply.

Figure 2:
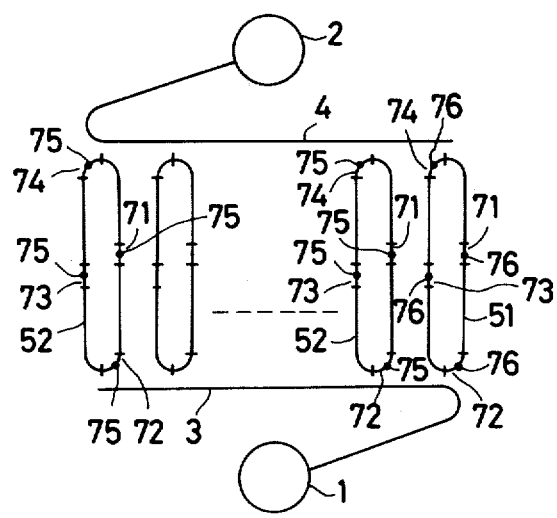
FIG. 2 is a constructional diagram of another embodiment of the bubble chip according to this invention.

FIG. 2 shows the construction of another embodiment of the bubble chip according to this invention. The embodiment of FIG. 2 differs from the embodiment of FIG. 1 in that masked areas 71-74 are provided in a plurality of places of the marker loop 51 and in the corresponding places of each of the storage loops 52, and that defect information indicating if the corresponding storage loop 52 is a defective loop is written into a specified address 75 of each of the masked areas in advance, while an address marker is written into the corresponding address 76 of the marker loop 51.

In reading out the defective loop information thus written, when the marker of the marker loop 51 has been detected for the first time, the information of the addresses of the storage loops corresponding to the address assigned to the marker may be read out. In this way, the read time of the defective loop information can be drastically shortened to enhance the processing speed still more.

By setting such a marker loop to correspond to the last bit of the read data as shown in the figure, a masking process for inhibiting the ordinary read and write operations is unnecessary. More specifically, the magnetic bubble memory has the storage loops whose number is greater than the number of bits per page as described previously, it executes the read or write of one page by the use of the non-defective loops while skipping over the defective storage loops, and it stops the operation upon completion of the read or write of one page. Therefore, if a marker loop is located at any position before the completion of the read or write, it must be masked. In contrast, when the marker loop corresponding to the last bit of the read data is disposed as stated above, the masking is not required. Accordingly, an operating mechanism and a driving circuit for the masking process can be omitted. However, if it is deemed that this further circuit reduction is not necessary to the particular memory in question, the marker loop may, of course, be made the head or first loop or an intermediate loop.

An example of a control device for reading and writing ordinary date and defect information by the use of the bubble chip of this invention as described in FIGS. 1 and 2 will now be explained in detail hereunder.

Figure 3:
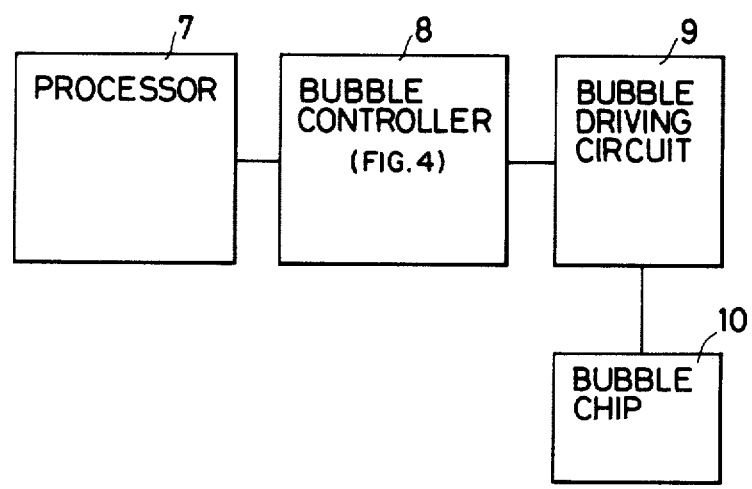
FIG. 3 is a general block diagram of a magnetic bubble memory device which includes a bubble chip of either FIG. 1 or FIG. 2.

FIG. 3 shows a schematic block diagram of an embodiment of the magnetic bubble memory device according to this invention. At a command from a processor 7 such as a microcomputer, a bubble controller 8 is operated. Under the control of the controller 8, respective storage loops within a bubble chip 10 are driven through a driving circuit 9. One example of a bubble driver circuit 9 is a circuit reported in an article entitled "Bubble Memory for Microprocessor Mass Storage" by David M. Lee, IEEE Compcon., Spring 1977, Proceedings.

FIG. 4 shows an example of a specific arrangement of the principal portions of the bubble controller 8 shown in FIG. 3.

Referring to the figure, numeral 81 designates a page address counter which indicates a page address for the read or write operations and which effects one increment each time one page has been read or written. Numeral 82 designates a page counter which counts the number of pages read or written, which has a predetermined number of pages set in advance and which effects one decrement each time one page has been read or written. Numeral 83 designates a loop counter which indicates the number of a storage loop storing a bit within a page being read or written and which effects one increment for every clock pulse. Numerals 84-86 designate comparators which compare the contents of the counters 81-83 with predetermined values $R_1$-$R_3$, respectively, and which provide outputs when the contents of the respective counters 81-83 have reached the predetermined values. Assuming, by way of example, that the page addresses for storage are from address 0 to address 1,023, the predetermined value $R_1$ of the comparator 84 is set at "1,024", and an output "1" is provided from the comparator 84 when the read or write of 1,024 pages has ended. "0 (zero)" is set as the predetermined value $R_2$ of the comparator 85. Further, assuming that the storage loops within the bubble chip are from No. 0 to No. 287, "288" is set as the predetermined value $R_3$ of the comparator 86. The predetermined values $R_1$–$R_3$ may be set either within the bubble controller 8 or from the processor 7.

Numeral 87 designates an operation switch which generates predetermined control signals $S_1$–$S_3$ at a command S from the processor 7. Among these command signals $S_1$–$S_3$, the signal $S_1$ is a control signal for reading out the detective loop information written in the bubble chip and storing them into a random access memory (hereinbelow, abbreviated to "RAM") to be stated later, the signal $S_2$ is a control signal for writing the defective loop information into the bubble chip, and the signal $S_3$ is a control signal for the ordinary read and write operations. The controls described above shall be made when the signals $S_1$–$S_3$ are "1". The operation switch 87 is constructed of, for example, a decoder, and provides the control signal corresponding to the command S from the processor 7.

Numeral 88 designates a flip-flop which holds the output of the comparator 86, numeral 89 the RAM which stores therein the defective loop information written in the bubble chip as stated above, numeral 90 a bubble controller which performs such controls as applying a rotating magnetic field to the bubble chip, numeral 91 a shift register which temporarily stores data to-be-written from the processor 7 or read data to the processor 7, and numeral 92 a clock generator which generates clock pulses for the bit shift of the shift register 91 and for the loop number counting of the loop counter 83. Numerals 93–96 designate AND gates, and numerals 97–99 OR gates.

$P_1$ and $P_2$ designate the page address and the page number, respectively, which are delivered from the processor 7 and which are set in the page address counter 81 and the page counter 82. T designates a page signal which is provided each time the read or write of a page is started. It is used for the increments of the page address counter 81 and the page counter 82, and is simultaneously used as the reset signal of the loop counter 83. Further, D designates data delivered and received between the bubble controller 8 and the processor 7, $D_1$ the data to be written into the bubble chip, and $D_2$ the data read out from the bubble chip. Among them, the data $D_1$ are data which are put into the bubble generator 1 within the bubble chip 10 through the bubble driver circuit 9, and the data $D_2$ are data which have been read out via the bubble driver circuit 9 from the bubble detector 2 within the bubble chip 10.

The ordinary read and write operations will now be explained in conjunction with FIG. 4.

In this case, according to the command S from the processor 7, only the output signal $S_3$ of the operation switch 87 becomes "1" while the other output signals $S_1$ and $S_2$ are "0". Data are written into the RAM 89 only when the control signal $S_1$ is "1", while data is read from the RAM 89 when it is "0". On the other hand, the page address and the desired page numbers are set from the processor 7 into the counters 81 and 82, respectively.

The loop counter 83 effects one increment for every clock pulse from the clock generator 92. Using the output of the counter 83 as an address, the contents of the RAM 89 is read out, and it is applied to the AND gate 96 through the OR gate 99. More specifically, the defect information of each loop number is stored in the RAM 89. If the loop of the number corresponding to the addess from the loop counter 83 is not a defective loop, "1" is read out, and if it is a defective loop, "0" is read out. These codes "1" and "0" correspond to the state in which the magnetic bubble is written and the state in which it is not written, respectively. Accordingly, when "1" has been read out from the RAM 89, the clock pulse from the clock generator 92 is applied to the shift register 91, and a bit shift of the shift register 91 is carried out. In contrast, when "0" has been read out from the RAM 89, the clock pulse is not applied to the shift register 91. In consequence, the shift of the shift register 91 is inhibited, and the defective loop is skipped.

When the reading or writing of information of one page has ended, the page signal T is transmitted in order to begin reading or writing of information of the next page, so that the counters 81 and 82 are respectively incremented and decremented. When, in this manner, the contents of the counter 81 or 82 has become the predetermined value $R_1$ or $R_2$, the output "1" is sent from the comparator 84 or 85 to the bubble controller 90, and the read or write operation is stopped. Accordingly, when the read or write operation has proceeded to a predetermined page, e.g., page 1,024, the read or write operation is stopped at that time. Therefore, the succeeding pages, e.g., pages 1,025 to 1,152 are masked, and a user will not have to be concerned with the destruction of data.

Now, in writing the defective loop information into the specified address of the masked area within the bubble chip as stated above, the output signal $S_2$ of the operation switch 87 is made "1" by the command S from the processor 7. This enables the AND gate 96 through the OR gates 97 and 99 to impress the clock pulse from the clock generator 92 on the shift register 91. Simultaneously, the desired page address is set in the page address counter 81, and "1" is set in the page counter 82. In this case, the output signals $S_1$ and $S_3$ of the operation switch 87 are "0". Therefore, even when the contents of the page address counter 81 has become the set value, a stop signal for the write operation is not issued, so that the information can be written into the specified page of the masked area. While the content of the RAM 89 is read out owing to "0" of the control signal $S_1$, the shift register 91 operates continuously because "1" is continually entered into one input of the OR gate 99. When, in this way, the writing of the defect information into the specified page has ended, the output "1" is provided from the comparator 85, and the output "1" is provided from the AND gate 94 and sent to the bubble controller 90, so that the write operation is stopped.

Further, in the case of reading out the defective loop information from the bubble chip and writing it into the RAM 89, the output signal $S_1$ of the operation switch 87 is made "1" by the command S from the processor 7. This puts the RAM 89 into the write mode, and enables the AND gate 96 through the OR gates 97 and 99 so as to impress the clock pulses on the shift register 91. Thus, the information $D_2$ read out from the bubble chip are sequentially written into the RAM 89 in accordance with the addresses from the loop counter 83. When the page address in which the defect information is stored has been reached, and the address marker of the marker loop at the last bit has been read out and stored into the uppermost bit of the shift register 91, then the "1" outout at that time is applied to the AND gate 95. Since the contents of the loop counter 83 is the predetermined value $R_3$ at that time, "1" is provided from the flip-flop 88, with the result that "1" is provided from the AND gate 95 and that the operation of reading out the information from the chip is stopped. Thus, the defective loop information is stored in the RAM 89.

In the arrangement of FIG. 4, an ordinary register can be substituted for the RAM.

The circuit arrangement shown in FIG. 4 includes only the circuits necessary for explaining the read and write operations according to this invention. Further details of the circuit arrangement are not required for the description of this invention since the details of the illustrated components are well known to those of ordinary skill in the art.

In the foregoing embodiments, the specified marker loop is provided so as to indicate the address in which the defect information is stored. In that case, the address of the marker of the marker loop does not always need to be the same as the addresses of the ordinary loops in which the defect information are stored, but addresses lying in a specific relationship to the marker address may be used for storing the defect information.

It is also permissible to omit the marker loop itself and to store the defective loop information in specific addresses. In this case, the specific page address may be set in the page address counter 81, and only the contents of the particular page may be read out and stored in the RAM 89.

As set forth above, according to this invention, with a comparatively simple and inexpensive construction, the yield can be significantly enhanced while the processing speed can be raised conspicuously.

Although, in the foregoing embodiments, the description of the invention has been in regard to magnetic bubble memory devices, it is to be understood that the present invention is not restricted thereto, but that it is also applicable to a semiconductor memory device having a plurality of storage loops.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A memory device comprising:
   storage means having a plurality of information storage loops, in each of which information representing whether or not the corresponding storage loop is a defective loop is written in a predetermined address of the corresponding storage loop; and
   at least one marker storage loop in which a specific marker is written in a specified address corresponding to the predetermined address of said information storage loop; and
   control means for reading and writing information of the same addresses of the respective storage loop of said storage means in parallel.

2. A memory device according to claim 1, wherein each of said storage loops has at least one storage unit which comprises a masked area in which reading and writing operations other than information representing whether or not the corresponding storage loop is a defective loop are not performed, said predetermined address being set in said masked area.

3. A memory device according to claim 1, wherein each of said storage loops has at least one storage unit in which information representing whether or not the corresponding storage loop is a defective loop is written in a plurality of specified addresses.

4. A memory device according to claim 3, wherein said storage unit comprises a plurality of masked areas in which reading and writing operations other than information representing whether or not the corresponding storage loop is a defective loop are not performed, and the specified address is set in each of said masked areas.

5. A memory device according to claim 1, wherein said marker loop is a magnetic bubble storage loop.

6. A memory device according to claim 1, wherein each of said storage loops has at least one masked area in which reading and writing operations other than information representing whether or not the storage loop is a defective loop are not performed, and further wherein the address corresponding to said predetermined address is set in said masked area.

7. A memory device according to claim 5, wherein said marker loop is a storage unit which corresponds to the last bit of data to be read out from said storage means.

8. A memory device according to claims 5, 6 or 7, wherein said, information storage loops comprise circulating magnetic bubble storage loops.

* * * * *